United States Patent [19]

Ko et al.

[11] Patent Number: 5,688,354
[45] Date of Patent: Nov. 18, 1997

[54] METHOD FOR ADHERING MASKING FILM

[75] Inventors: Kyoun-hee Ko, Incheon; Il-ho Kim, Bucheon; Chul-hee Kim, Incheon; Woung-kwan An, Bucheon, all of Rep. of Korea

[73] Assignee: Samsung Electronics Co., Ltd., Suwon, Rep. of Korea

[21] Appl. No.: 445,857

[22] Filed: May 22, 1995

Related U.S. Application Data

[62] Division of Ser. No. 212,896, Mar. 15, 1994, Pat. No. 5,472,554.

[30] Foreign Application Priority Data

Dec. 31, 1993 [KR] Rep. of Korea .................. 93-32281

[51] Int. Cl.⁶ .................................................. B32B 31/18
[52] U.S. Cl. ........................ 156/267; 156/64; 156/250; 156/248
[58] Field of Search .................................. 156/229, 248, 156/250, 267, 494, 495, 496, 522, 552, 555, 361, 362, 64

[56] References Cited

U.S. PATENT DOCUMENTS

| | | |
|---|---|---|
| 4,436,251 | 3/1984 | Deyesso et al. . |
| 4,522,679 | 6/1985 | Funakoshi et al. ............... 156/267 X |
| 4,680,079 | 7/1987 | Tanaka . |
| 4,865,677 | 9/1989 | Matsushita et al. . |
| 4,925,515 | 5/1990 | Yoshimura et al. ............... 156/250 |
| 5,310,442 | 5/1994 | Ametani . |

FOREIGN PATENT DOCUMENTS

| | | | |
|---|---|---|---|
| 62-174940 | 7/1987 | Japan .............................. 156/248 |
| 3-84949 | 4/1991 | Japan . |
| 2 159 763 | 12/1985 | United Kingdom ................ 156/249 |

*Primary Examiner*—Melvin Mayes
*Attorney, Agent, or Firm*—Cushman Darby & Cushman, IP Group of Pillsbury Madison & Sutro LLP

[57] ABSTRACT

A masking film adhering method for transporting smoothly and accurately a masking film tape to which a wafer is stuck to the cutting location where the masking film is to be cut. The wafer is stuck onto the masking film tape by passing the masking film tape and the wafer through upper and lower adhesive rollers. The separation of the masking film tape is then increased from a cutting table so that the masking film tape having the wafer stuck thereon may not become adhered to the cutting table, by moving the upper adhesive roller upwardly when the wafer completely passes through the adhesive roller. After the masking film is transported to a cutting location, maintaining a predetermined distance between the masking film and the cutting table, the masking film tape is cut along the shape of the wafer. Sagging of the masking film due to the weight of the wafer is prevented to avoid the masking film tape adhesion to the cutting table. The wafer can be accurately placed onto the cutting location of the masking film tape, to prevent the wafer from being damaged by the cutter.

19 Claims, 6 Drawing Sheets

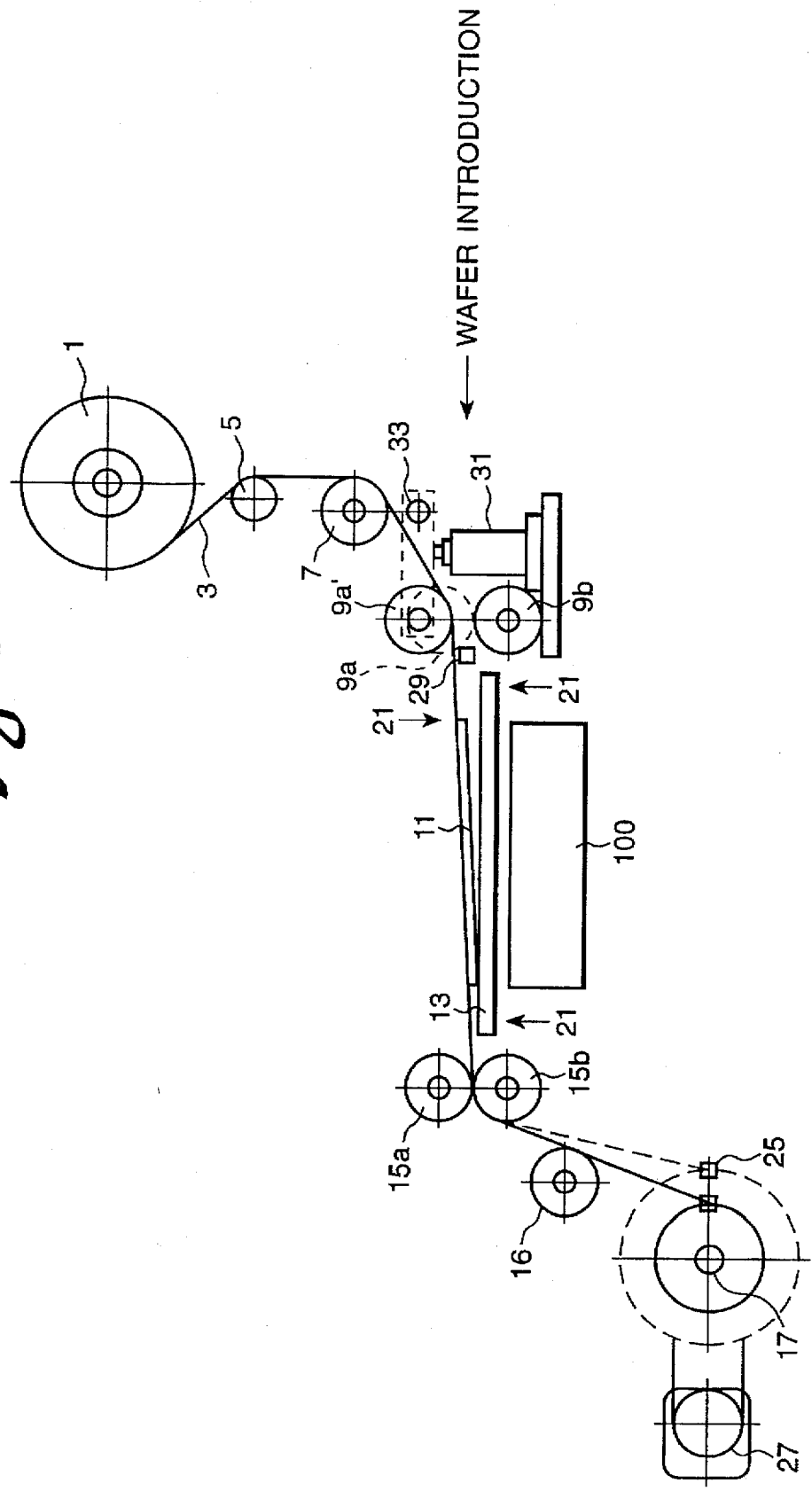

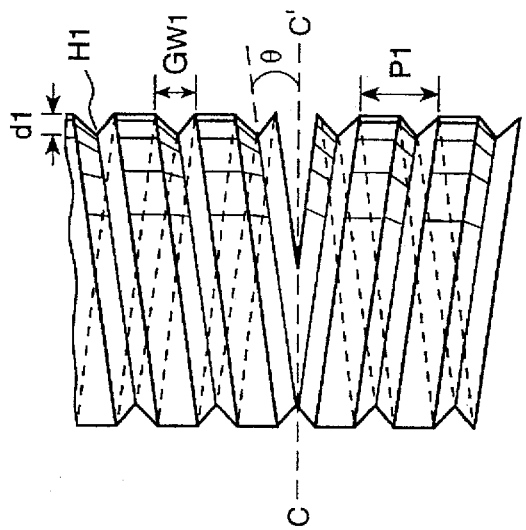
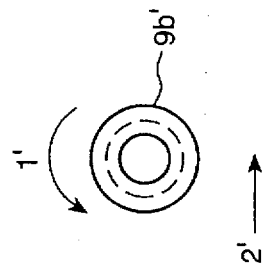
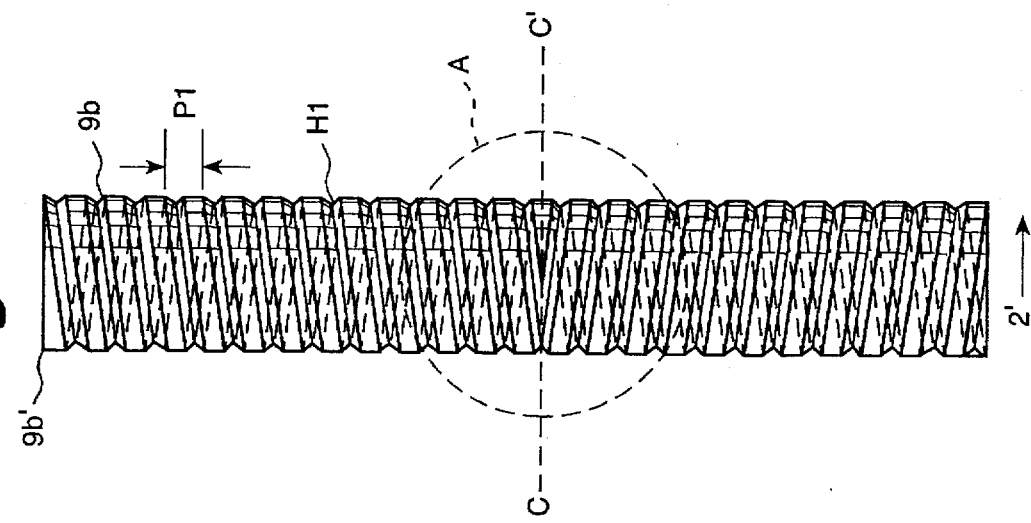

FORWARDING DIRECTION OF MASKING FILM TAPE

METHOD FOR ADHERING MASKING FILM

This is a division of application Ser. No. 8/212,896, filed Mar. 15, 1994 now U.S. Pat. No. 5,972,559.

BACKGROUND OF THE INVENTION

The present invention relates to a method for adhering a masking film to a wafer and an apparatus therefor, and more particularly, to a method for adhering a masking film to a silicon wafer by precisely cutting the masking film, and an apparatus therefor.

The integrated circuit manufacturing process involves steps of the crystallizing process, the pre-wafer process, the after-wafer process, the packaging process and the testing process. In the crystallizing process, the slicing, lapping, polishing or back-grinding steps are performed after crystallization of the silicon. The lapping step is aimed at removing the strained layer, which was generated in the slicing step, from the surface of the silicon crystal, and at thinning the sliced thick crystalline wafer to a predetermined thickness and finishing the sliced surface so as to have a mirror finish for electric circuit formation. Accordingly, a considerably high precision is required for surface flatness.

Recently, it has become routine to perform the thinning process after the wafer forming process, to fulfill packaging requirements and to enhance heat dissipation as well as to reduce the size of the package. In the case of CMOS devices and the like which generate less heat, the thinning of the wafer is less critical. However, in order to minimize the size of the package, the thinning step is necessary. In the process of thinning the wafer, the back side of the wafer is lapped or grinded.

Prior to the lapping stage, the overall surface of the silicon wafer where a circuit is to be formed is coated with a protective film, or a masking film is stuck to the circuit face of the silicon wafer. This operation is intended to protect the circuit face of the silicon wafer during the lapping, etching or back grinding step. This operation has been carried out manually. Specifically, a manual operation has been relied upon to cut off the outer periphery of the masking film, which extends over he silicon wafer edge, along the outer periphery of the silicon wafer. Even though this manual operation is performed by a skilled worker, it is inefficient and troublesome. To solve the problems resulting from this manual operation, a method and apparatus for automatically cutting the masking film has been disclosed in U.S. Pat. No. 4,779,497 (issued to Mishahiro Lee). In addition, a method for automatically peeling the masking film has been disclosed in Japanese Laid-open Publication No. 639122.

FIG. 1 schematically depicts a conventional apparatus for adhering a masking film to a silicon wafer. As shown in FIG. 1, the apparatus includes masking film tape supply roll 1, masking film tape 3, first guide roller 5, second guide roller 7, adhesive rollers 9a and 9b consisting of upper and lower rollers, wafer 11, cutting table 13, supporting rollers 15a and 15b consisting of upper and lower rollers, and masking film tape take-up roll 17. Arrow 21 denotes the cutting location of a masking film.

One process for adhering a masking film onto a wafer using the above apparatus is as follows. First, masking film tape 3 is drawn out from masking film tape supply roll 1. Then, masking film tape 3 passes through first guide roller 5 and second guide roller 7 and is transported to upper and lower adhesive rollers 9a and 9b.

One surface of masking film tape 3 which contacts wafer 11 is coated with adhesives and acquires adhesiveness. Wafer 11 is provided from the right side of adhesive rollers 9a and 9b so that the adhesive surface of masking film tape 3 and the circuit face of wafer 11 may come into contact with each other. Thus, wafer 11 and masking film tape 3 together pass through adhesive rollers 9a and 9b. Masking film tape 3 is stuck onto wafer 11 by adhesive rollers 9a and 9b, and then transported onto cutting table 13 by the driving force of masking film tape take-up roll 17. During the transportation, masking film tape 3 moves while maintaining an approximately 5 mm spacing between masking film tape 3 and cutting table 13. Masking film tape 3 stops when wafer 11 is positioned over the aperture in the center portion of cutting table 13. Supporting rollers 15a and 15b support the masking film tape, at a height roughly equivalent with that achieved by adhesive rollers 9a and 9b, so that masking film tape 3 moves horizontally while maintaining a predetermined space from cutting table 13. At the state where masking film tape 3 stops, a cover (not shown) having a vacuum chuck therein is placed on the upper portion of wafer 11, to thereby fix wafer 11 and masking film tape 3. At the fixed state of the wafer on cutting table 13, a cutter (not shown) located at the lower portion moves upward and cuts masking film tape 3 along the periphery of the wafer.

FIG. 2 is a plan view showing wafer 11 situated over cutting table 13. Here, reference numeral 13a denotes an aperture formed in the center portion of cutting table 13 so as to receive wafer 11, and reference numeral 21a denotes a cutting line which exists between aperture 13a and wafer 11. With wafer 11 placed over the center of aperture 13a of cutting table 13 as shown in FIG. 2, a cutter (not shown) provided below cutting table 13 cuts masking film tape 3 along cutting line 21a (which coincides with cutting location 21 of FIG. 1) between wafer 11 and aperture 13a, to form a wafer-shaped cut at the inner portion of masking film tape 3, thereby adhering a masking film onto the wafer. After the cutting operation, wafer 11 covered (adhered) with the masking film is transported by a vacuum chuck (not shown) for a subsequent process. In addition, the remaining masking film tape 3 which has been cut along the shape of wafer 11 and bears a wafer-shaped hole, passes through supporting rollers 15a and 15b and is wound on masking film tape take-up roll 17.

A problem with the above described method is that masking film tape 3 may be wound onto lower adhesive roller 9b instead of being passed between the rollers, due to the adhesive force of masking film tape 3. As a result, when wafer 11 is introduced to the apparatus between adhesive rollers 9a and 9b, the wafer is broken as it becomes wrapped around the lower adhesive roller. FIG. 3 illustrates this phenomenon wherein masking film tape 3 becomes wound onto lower adhesive roller 9b.

Another problem is that the masking film tape 3 sags due to the weight of silicon wafer 11, which causes masking film tape 3 to adhere to or be snagged by cutting table 13. FIG. 4 illustrates this phenomenon wherein masking film tape 3 becomes adhered to the peripheral edge of cutting table 13 due to the weight of wafer 11. Regions A and B of FIG. 4 show the portions of masking film tape 3 which adheres to cutting table 13.

Further, in the conventional method for adhering a masking film, a motor for driving masking film tape take-up roll 17 is operated without any consideration of the wound amount of the masking film tape accumulated after the cutting operation. When the wound amount of masking film tape 3 is large, the diameter of the take-up roll of tape is large and a greater tension is applied to masking film tape 3 in the lengthwise direction. In this case, since the inner portion of masking film tape 3 which is being wound onto masking film tape take-up roll 17 has a plurality of serial cuts punched according to the shape of wafer 11, the lengthwise tension cannot be uniformly applied to masking film tape 3 across its width. Due to this non-uniform tension, the location of the silicon wafer cannot be precisely controlled.

In the above case, wafer 11 is damaged by the cutter and/or the cutting of masking film tape 3 is rendered without uniformity.

Further, since the tension can be applied only at the outer portions of masking film tape 3 remaining after the cutting process, the inner portion of masking film tape 3 becomes wrinkled. FIG. 5 illustrates masking film tape 3 having a wrinkled portion 4 formed in the inner portion thereof between the wafer-shaped holes. In such a case, the wrinkled portion is not completely cut by the cutter during the cutting process, thereby inhibiting separation from the tape. Therefore, wafer 11 is dragged by masking film tape 3 which continues being wound, which results in damage to wafer 11. In FIG. 5, region C shows the portion where the incomplete cutting of masking film tape 3 occurs.

SUMMARY OF THE INVENTION

It is an object of the present invention to provide a method for adhering a masking film onto a wafer, to smoothly and precisely transport the masking film tape having the wafer stuck thereon, and to precisely place the wafer at the location where the masking film is to be cut.

It is another object of the present invention to provide an apparatus suitable for performing the above method.

To accomplish the above objects of the present invention, there is provided a method for adhering a masking film onto a wafer, comprising the steps of: sticking the wafer onto a masking film tape; increasing the separation of the masking film tape from a lower structure by a predetermined distance so that the masking film tape is not adhered to the lower structure; transporting the masking film tape to a cutting location, maintaining a regular distance between the lower structure and the masking film tape; and cutting the masking film tape along the shape of the wafer at the cutting location.

According to an embodiment of the present invention, it is preferable to apply a tension to the masking film tape in the crosswise direction of the masking film tape while transporting the masking film tape. Further, transporting the masking film is performed by applying a regular lengthwise tension to the masking film tape. For example, the step of sticking the wafer onto the masking film tape may be performed by passing the wafer and the masking film tape through adhesive rollers consisting of upper and lower rollers. In such a case, the step of increasing the separation of the masking film tape from the lower structure is performed by moving upwardly the upper adhesive roller immediately after the wafer passes through the adhesive rollers.

To accomplish another object of the present invention, there is provided an apparatus for a masking film adhesion comprising: means for sticking a wafer onto a masking film tape; means for cutting the masking film tape along the shape of the wafer; means for transporting the masking film tape having the wafer stuck thereon to a cutting location of the masking film tape; and means for moving the masking film tape upwardly immediately after the wafer which is stuck on the masking film tape passes through the adhering means so as to prevent the masking film tape from adhering to a lower structure. In the preferred embodiment of the present invention, the sticking means comprises an adhesive roller assembly consisting of upper and lower rollers. In such a case, the moving means comprises means for moving the upper roller upwardly by a predetermined distance after the wafer passes through the sticking means. The upper roller moving means comprises a shifter for moving the upper roller upwardly, and a sensor for sensing whether the wafer has passed through the sticking means.

In a preferred embodiment of the present invention, grooves are formed in a two-directional radial manner on the peripheral portion of the lower adhesive roller. The grooves enable the application of a crosswise tension to the masking film tape from the inner portion to both outer portions of the masking film tape, to prevent the inner portion of the masking film tape from becoming wrinkled when lengthwise tension is applied to the masking film tape by the transporting means.

In a preferred embodiment of the present invention, the transporting means comprises a supporting roller assembly having a roughly equal height as the sticking means and consisting of upper and lower rollers, to support the masking film tape which passes through the cutting means in the course of transporting the masking film tape, and a masking film tape take-up roll for winding the remaining masking film tape. Preferably, at least one of the upper and lower rollers of the adhesive roller assembly, and both upper and lower rollers of the supporting roller assembly, have grooves formed in the two-directional radial manner on their peripheral portions to apply a crosswise tension from the inner portion to both outer portions of the masking film tape. Preferably, the apparatus of the present invention further comprises a guide roller between the supporting roller assembly and the masking film tape take-up roll, the guide roller contacting the upper surface (which is not coated with adhesives) of the masking film tape and having grooves formed in a two-directional radial manner on the peripheral portion thereof so as to apply a crosswise tension from the inner portion to both outer portions of the masking film tape. Providing the guide roller as above enhances the crosswise tension.

In still another embodiment of the present invention, the apparatus further comprises a torque motor for applying a predetermined lengthwise tension to the masking film tape so as to maintain a regular linear winding speed of the masking film tape. A predetermined lengthwise tension can be applied to the masking film tape independently from the wound amount of the masking film tape on a masking film tape take-up roll.

In yet another embodiment of the present invention, the cutting means comprises: a cutting table having an aperture formed in the center portion where the wafer is located and a wafer supporting portion for supporting the wafer located in the aperture; and a cutter provided below the cutting table. A plurality of grooves are preferably formed in an upper portion of the cutting table perpendicular to the forwarding direction of the masking film tape to prevent the masking film tape from being adhered to the cutting table.

According to the present invention, after sticking a wafer onto a masking film tape by means of the adhesive roller assembly consisting of an upper roller and a lower roller, the upper adhesive roller is moved upwardly by a predetermined distance, by sensing whether a wafer passes through the adhesive roller assembly. Adhesion of the masking film tape to the cutting table which occurs when the masking film tape sags due to the weight of a wafer, is prevented. Accordingly, the wafer can be precisely placed onto a cutting location, to thereby prevent a wafer from being damaged by the cutter.

In addition, the crosswise tension is applied to the masking film tape from the inner portion to both outer portions of the masking film by forming the two-directional radial grooves in the peripheral portion of the lower adhesive roller and/or a supporting roller, when the masking film passes through the above rollers. Accordingly, a phenomenon wherein the inner portion of the masking film tape is wrinkled by the lengthwise tension, which is applied thereto upon winding the masking film tape, can be prevented. As a result, the efficiency of cutting the masking film can be enhanced.

BRIEF DESCRIPTION OF THE DRAWINGS

The above objects and other advantages of the present invention will become more apparent by describing in detail a preferred embodiment thereof with reference to the attached figures in which:

FIG. 6 is a schematic view of an apparatus for adhering a masking film to a wafer according to an embodiment of the present invention;

FIG. 7A is a top view illustrating the lower adhesive roller of FIG. 6 having grooves in a two-directional radial manner formed on the surface thereof;

FIG. 7B is a side view (9b' side) of the lower adhesive roller of FIG. 7A;

FIG. 7C is an enlarged view of the center portion (A portion) of the lower adhesive roller of FIG.7A;

DETAILED DESCRIPTION OF THE INVENTION

The present invention will be explained in more detail with reference to the attached figures.

Figure 1:
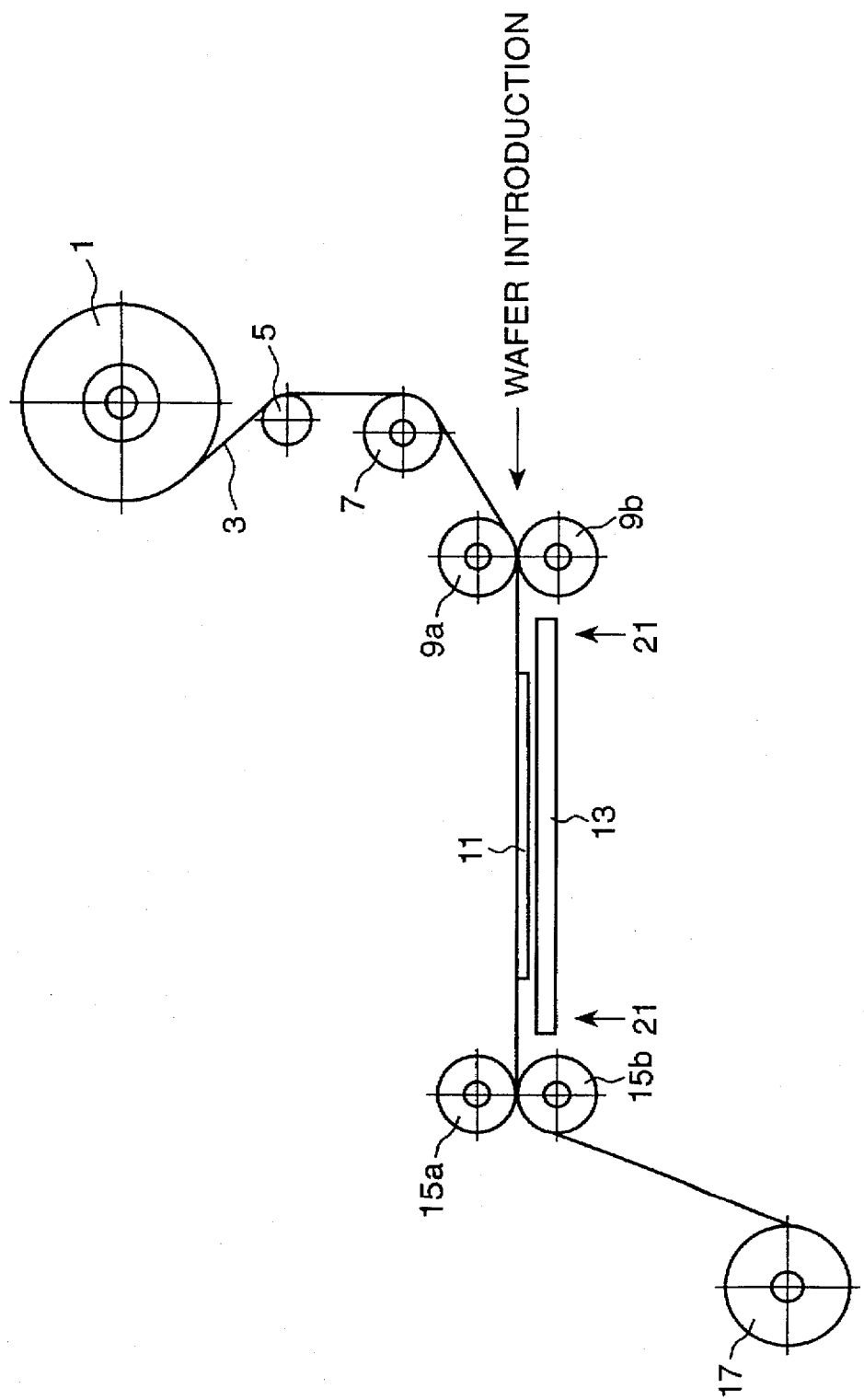
FIG. 1 is a schematic view for illustrating a conventional apparatus for adhering a masking film on a silicon wafer.

FIG. 6 reference numerals correspond to like elements of FIG. 1 having the same reference numerals. As shown in FIG. 6 the invention includes sensor 25 for measuring the amount of masking film tape wound on take-up roll 17, torque motor 27 for controlling the rotation speed of masking film tape take-up roll 17 to have a regular linear speed depending on the amount of masking film tape wound on take-up roll 17, sensor 29 for sensing whether a wafer has completely passed through adhesive rollers 9a and 9b, shifter 31 for moving upwardly upper adhesion roller 9a, and roller holder 33 for supporting upper adhesion roller 9a.

The method for adhering a masking film onto a wafer using the above apparatus is as follows. In this embodiment, the method wherein a masking film is adhered onto a wafer having a diameter of 200 mm will be explained.

The unused masking film tape 3 having a width of 240 mm is drawn from masking film tape supply roll 1 and passes through first guide roller 5 and second guide roller 7 and is transported to upper and lower adhesion rollers 9a and 9b each having a diameter of 40 mm and a length of 250 mm. Wafer 11 is stuck onto masking film tape 3 by adhesion rollers 9a and 9b. It is desirable to form V-shaped grooves H1 in a two-directional radial manner (so as to form opposing helixes) in the peripheral portion of lower adhesion roller 9b. FIG. 7A is a top view illustrating lower adhesive roller 9b having grooves H1 in a two-directional radial manner formed on the surface thereof, FIG. 7B is a side view (9b' side) of lower adhesive roller 9b and FIG. 7C is an enlarged view of the center portion (A portion) of lower adhesive roller 9b. As shown in FIGS. 7A to 7C, grooves H1 are formed in the two-directional radial manner (so as to form opposing helixes which meet at the line C–C') on the peripheral surface portion of lower adhesion roller 9b. The depth d1 of the groove H1 is approximately 2 mm, the width Gw1 is approximately 2 mm, and the pitch P1 of the grooves H1 is approximately 5 mm. Additionally, the angle θ of the grooves H1 with respect to the line C–C' (which corresponds to the center line of masking film tape 3) is about 30 degrees. In FIGS. 7A and 7B, arrow 1' denotes the rotation direction of lower adhesive roller 9b, while arrow 2' denotes the forwarding direction of masking film tape 3. Forming groove H1 as above prevents the inner portions of masking film tape 3 from being wrinkled since a tension due to the grooves formed in the two-directional radial manner is applied to masking film tape 3 from the inner portion to both outer portions of masking film tape 3 in the perpendicular direction to the forwarding direction of masking film tape 3 (that is, the crosswise direction of masking film tape 3) when masking film tape 3 passes through adhesive rollers 9a and 9b. Also, the presence of the grooves H1 prevents the adhesion of masking film tape 3 to the lower adhesive roller 9b.

Wafer 11 is introduced from the right side of adhesive rollers 9a and 9b to adhesive rollers 9a and 9b so that the adhesive surface of masking film tape 3 and the circuit face of wafer 11 contact each other as they pass through adhesive rollers 9a and 9b. After wafer 11 is stuck onto masking film tape 3 by adhesive rollers 9a and 9b, wafer 11 completely passes through adhesive rollers 9a and 9b. This is sensed by sensor 29 provided on cutting table 13 or between cutting table 13 and adhesive rollers 9a and 9b. Then, roller holder 33 which supports upper adhesive roller 9a is moved upwardly by shifter 31. As a result, upper adhesive roller 9a is moved upwardly by a predetermined distance. The moving distance of upper adhesive roller 9a is approximately 10 mm. Then, a motor for driving masking film tape take-up roll 17 operates, to thereby raise masking film tape 3 by approximately 10 mm due to the lengthwise tension applied to masking film tape 3 from the masking film tape take-up roll 17. That is, the driving force of the masking film tape take-up roll 17 raises the masking film tape 3. Upper adhesive roller 9a is moved, to increase the separation of masking film tape 3 from the lower structure, i.e., cutting table 13, by a predetermined distance. In this state, masking film tape 3 adhered with wafer 11 moves to the cutting location of masking film tape 3, that is, masking film tape 3 is moved and stopped when the center of wafer 11 corresponds to the center of the aperture formed in the center portion of cutting table 13. In FIG. 6, reference numeral 9a' denotes upper adhesive roller 9a which has been moved upwardly by approximately 10 mm. In the state where masking film tape 3 stops moving, shifter 31 moves back to its original location so that upper adhesive roller 9a contacts lower adhesive roller 9b.

Figure 2:
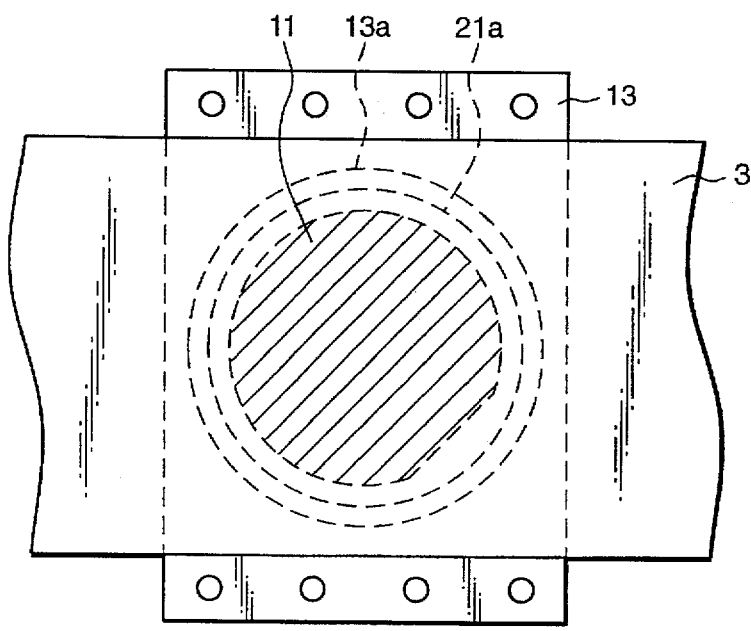
FIG. 2 is a plan view showing a wafer provided over a cutting table.
Figure 3:
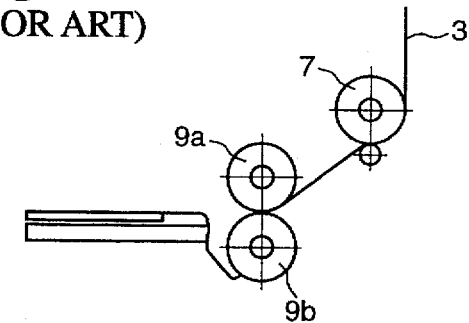
FIG. 3 illustrates a phenomenon wherein a masking film tape is wound onto a lower adhesive roller.
Figure 4:
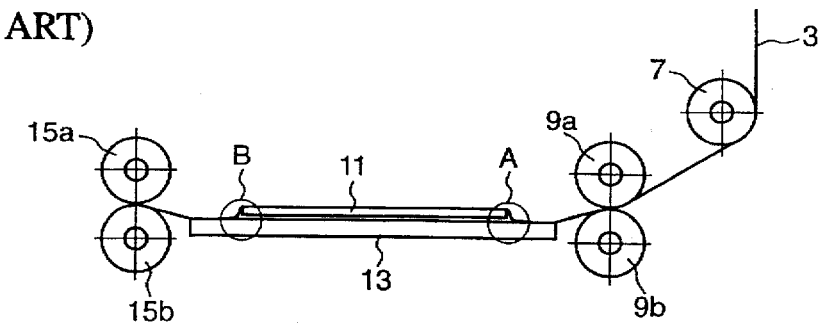
FIG. 4 illustrates a phenomenon where a masking film tape adheres to the peripheral of a cutting table due to the weight of the wafer.
Figure 5:
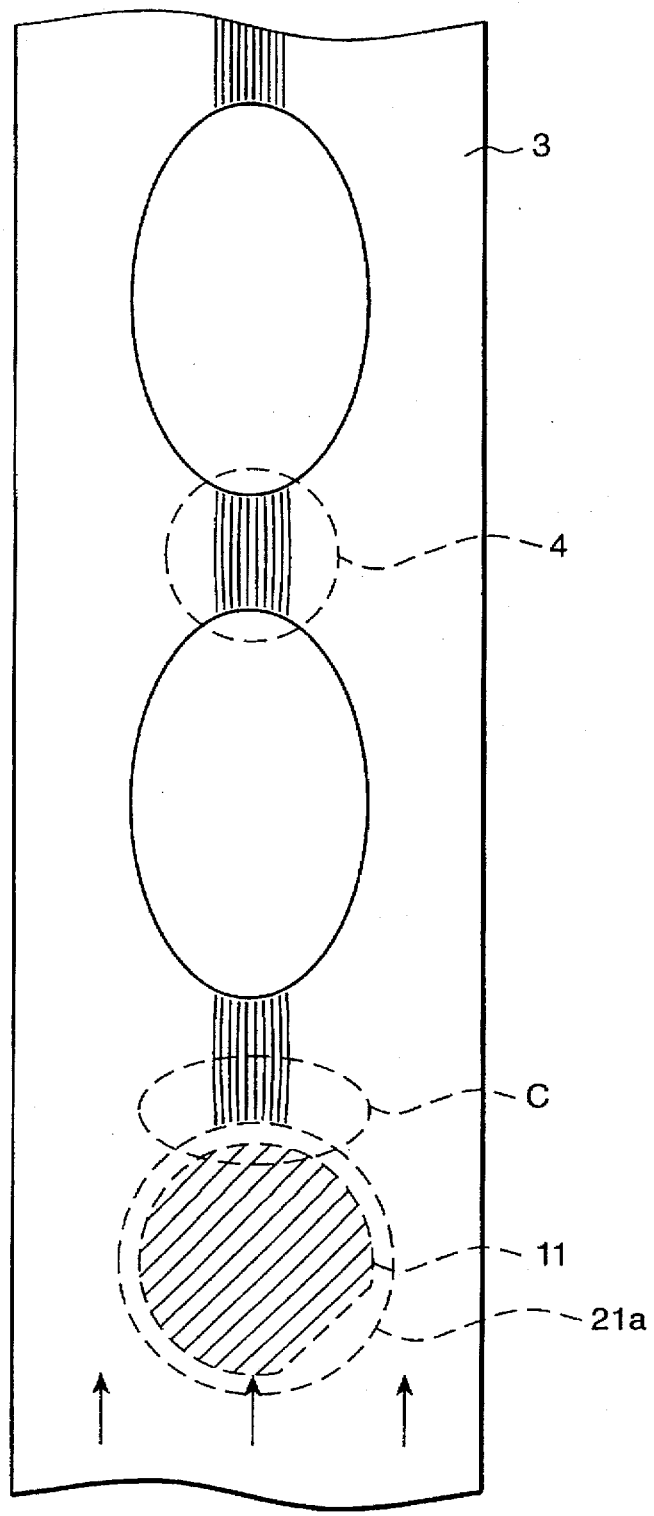
FIG. 5 illustrates a masking film tape having a wrinkled portion formed in the inner portion.

In the state where masking film tape 3 stops moving, a cover (not shown) wherein a vacuum chuck is provided is placed on the upper portion of masking film tape 3 which covers the circuit face of wafer 11, to thereby fix wafer 11 and masking film tape 3. In the state where wafer 11 and masking film tape 3 are fixed, a cutter 100 moves upwards from the lower portion of cutting table 13. Then, as shown in FIG. 2, the cutter cuts masking film tape 3 as a circular cutout along the periphery of wafer 11.

Figure 8A:
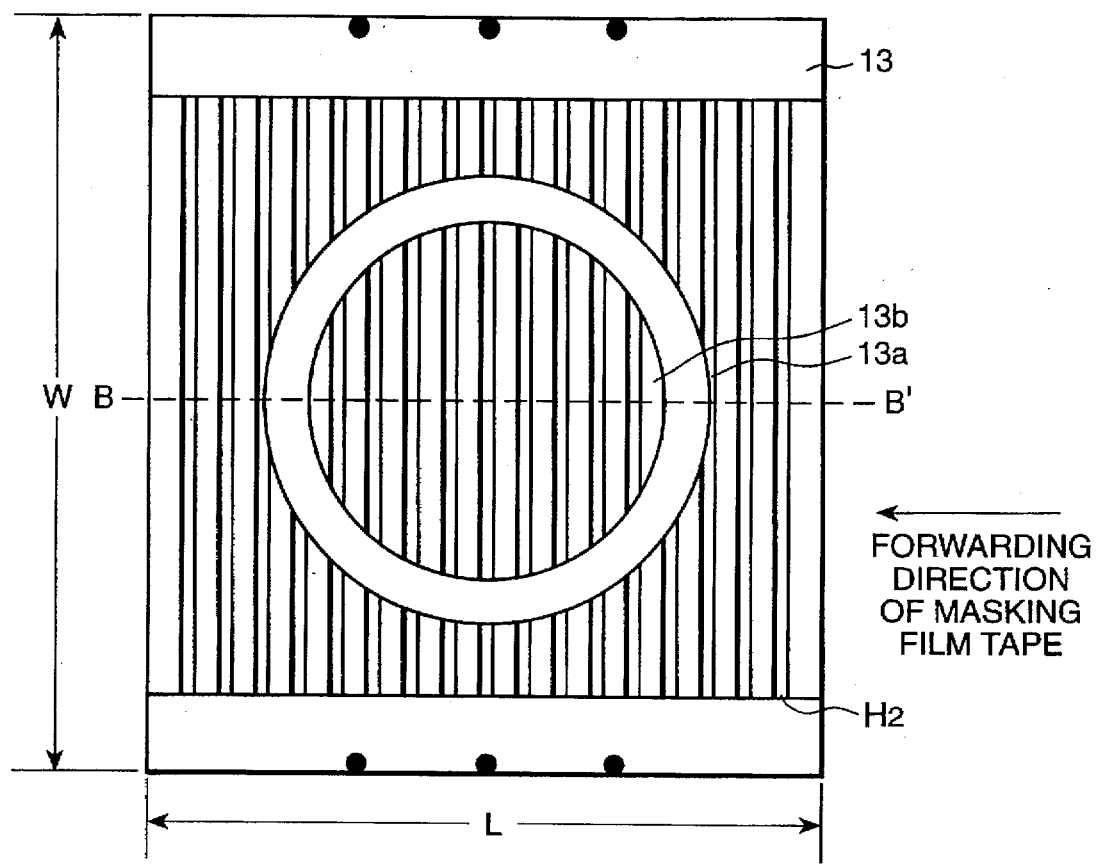
FIG. 8A shows an embodiment of a cutting table according to the present invention.
Figure 8B:
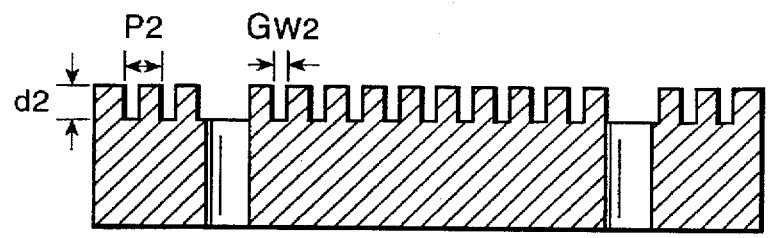
FIG. 8B is a cross-sectional view cut along the line B–B' of the cutting table of FIG. 8A.

FIG. 8A shows an embodiment of cutting table 13 according to the present invention and FIG. 8B is a cross-sectional view cut along the line B–B' of cutting table 13 of FIG. 8A. As shown in the figures, an aperture 13a having a little larger diameter of 220 to 225 mm than that of wafer 11 is formed in the center of cutting table 13 having a length (L) of 240 mm and a width (W) of 260 to 270 mm so as to place wafer 11. In the center of aperture 13a, a supporting portion 13b having a diameter of approximately 215 mm is provided for supporting wafer 11 and preventing the falling thereof. A plurality of U-shaped grooves H2 are formed in the perpendicular direction with respect to the forwarding direction of masking film tape 3, in the upper portion of cutting table 13. The depth d2, width Gw2 and pitch P2 of the grooves H2 are 3 mm, 3 mm and 6 mm, respectively. Forming grooves H2 as above prevents masking film tape 3 from being adhered to cutting table 13, so that masking film tape 3 is wound smoothly on masking film tape take-up roll 17.

Due to the cutting process, the masking film having a diameter of approximately 220 mm is adhered onto a wafer having a diameter of 200 mm. After the cutting process, wafer 11 adhered with the masking film is transported via the vacuum chuck for the subsequent processes. In addition, the remaining masking film tape 3 having the wafer-shaped holes after being cut along the shape of wafer 11 passes through the upper and lower supporting rollers 15a and 15b and a third guide roller 16 and is wound on masking film tape take-up roll 17. Supporting rollers 15a and 15b are at the same height as adhesive rollers 9a and 9b and support the masking film tape to enable masking film tape 3 to move horizontally while maintaining the separation from cutting table 13 by a predetermined distance. At least one of supporting rollers 15a and 15b, preferably the lower supporting roller 15b, and more preferably both lower and upper supporting rollers 15a and 15b, has the same two-directional radial V-shaped grooves as lower adhesive roller 9b. Third guide roller 16 is provided between supporting rollers 15a and 15b and masking film tape take-up roll 17 to be in contact with the upper surface (the opposing surface of the adhesive surface) of masking film tape 3. Also, third guide roller 16 preferably has the same two-directional radial V-shaped grooves as lower adhesive roller 9b. Third guide roller 16 may be manufactured to have the same shape as that of lower adhesive roller 9b. Thus, providing the supporting rollers and/or the third guide roller having the grooves as above, produces the tension applied in the crosswise direction of masking film tape 3 from the inner portion and toward the outer portions thereof. Accordingly, when the masking film tape is wound on the masking film tape take-up roll 17, the inner portion of masking film tape 3 can be prevented from being wrinkled by the lengthwise direction tension applied to masking film tape 3. As a result, the cutting process of masking film tape 3 can be easily performed.

Further, sensor 25 is provided to the axial portion of masking film tape take-up roll 17 for measuring the wound amount of masking film tape 3 onto masking film tape take-up roll 17. On the basis of the measured wound amount of the masking film tape on the masking film tape take-up roll, a torque motor drives masking film tape take-up roll 17 to deliver a predetermined tension. As a result, masking film tape 3 can be wound on masking film tape take-up roll 17 at a regular linear speed.

Wafer 11 having a masking film stuck thereon is moved so as to perform a wire cutting process by a wafer transfer having a vacuum chuck. Then, the masking film is sequentially adhered onto wafer 11 by repeating the above processes.

According to the present invention, adhesiveness between the lower adhesive roller and the masking film tape is decreased by forming the grooves in the surface portion of the lower adhesive roller. Therefore, the phenomenon that a masking film tape is wound onto the lower adhesive roller before the masking film tape is stuck onto a wafer can be prevented.

In addition, after the wafer is stuck on the masking film tape, whether the wafer completely passes through the adhesive roller is sensed using the sensor and then the upper adhesive roller is raised by a predetermined space. Thus, the masking film tape sagging due to the weight of wafer is prevented, to thereby avoid the masking film tape adhesion to the cutting table. Accordingly, a phenomenon of a wafer being damaged by a cutter 100 can be prevented since the wafer can be accurately placed in the cutting location of the masking film.

Further, a crosswise tension is applied to a masking film from the inner portion to both outer portions of the masking film tape by forming the two-directional radial grooves on the outer peripheral portions of the lower adhesive roller, supporting rollers and/or the third guide roller, when the masking film tape passes through the above rollers. Therefore, the phenomenon of the center (or inner) portion of the masking film tape being wrinkled by the lengthwise tension applied upon winding a masking film tape onto the masking film tape take-up roll, can be prevented. Since the center portion is not wrinkled, the incomplete cutting of a masking film tape can be prevented.

After measuring the wound amount of the masking film tape wound onto the masking film tape take-up roll for receiving the used masking film tape, a motor for operating the masking film tape take-up roll is operated using a torque motor so that a regular lengthwise tension may be applied to the masking film tape. Therefore, the masking film tape can be wound on the masking film tape take-up roll at a regular linear speed. Accordingly, damaging the wafer can be prevented since the wafer stuck on the masking film tape can be accurately placed on the cutting location of the masking film tape.

It is understood by those skilled in the art that the foregoing description is a preferred embodiment of the disclosed device and that various changes and modifications may be made in the invention without departing from the spirit and scope thereof.

What is claimed is:

1. A method for adhering a masking film onto a wafer, comprising the steps of:

sticking said wafer onto a masking film tape;

increasing a separation of said masking film tape from a lower structure by a predetermined distance so that said masking film tape is not adhered to said lower structure;

transporting said masking film tape to a cutting location, maintaining a regular distance between said lower structure and said masking film tape, a tension force being applied to said masking film tape in a crosswise direction of said masking film tape during said step of transporting said masking film tape; and cutting said masking film tape along a shape of said wafer at said cutting location.

2. A method for adhering a masking film onto a wafer according to claim 1, wherein:

said step of transporting said masking film tape is performed by applying a regular lengthwise tension to said masking film tape.

3. A method for adhering a masking film onto a wafer according to claim 1, wherein:

said step of sticking said wafer onto said masking film tape is performed by passing said wafer and said masking film tape through an upper adhesive roller and a lower adhesive roller.

4. A method for adhering a masking film onto a wafer, comprising the steps of:

sticking said wafer onto a masking film tape;

increasing a separation of said masking film tape from a lower structure by a predetermined distance so that said masking film tape is not adhered to said lower structure, said step of increasing said separation of said masking film tape from said lower structure being performed by moving upwardly an upper adhesive roller immediately after said wafer passes through said upper adhesive roller and a lower adhesive roller;

transporting said masking film tape to a cutting location while maintaining a regular distance between said lower structure and said masking film tape; and cutting said masking film tape along a shape of said wafer at said cutting location.

5. A method for adhering a masking film onto a wafer according to claim 4, wherein:

said step of transporting said masking film tape is performed by applying a regular lengthwise tension to said masking film tape.

6. A method for adhering a masking film onto a wafer according to claim 1, wherein:

said step of sticking said wafer onto said masking film tape is performed by passing said wafer and said masking film tape through said upper adhesive roller and said lower adhesive roller.

7. A method for adhering a masking film onto a wafer, comprising the steps of:

adhering said wafer onto a masking film by passing said wafer and said masking film through an upper adhesive roller and a lower adhesive roller;

increasing a separation of said masking film from a lower structure by moving upwardly said upper adhesive roller immediately after said wafer passes through said upper adhesive roller and said lower adhesive roller;

transporting said masking film to a cutting location while maintaining a distance between said lower structure and said masking film; and cutting said masking film along a periphery of said wafer at said cutting location.

8. A method for adhering a masking film onto a wafer according to claim 7, wherein said step of transporting said masking film includes a step of:

applying a tension force to said masking film in a crosswise direction of said masking film.

9. A method for adhering a masking film onto a wafer according to claim 8, wherein:

said tension force is applied to said masking film by grooves formed in said upper adhesive roller.

10. A method for adhering a masking film onto a wafer according to claim 9, wherein:

said grooves are formed in said upper adhesive roller perpendicular to a forward moving direction of said masking film.

11. A method for adhering a masking film onto a wafer according to claim 7, wherein said step of transporting said masking film includes a step of:

applying a regular lengthwise tension to said masking film.

12. A method for adhering a masking film onto a wafer according to claim 11 wherein:

said regular lengthwise tension is applied to said masking film by a torque motor.

13. A method for adhering a masking film onto a wafer according to claim 7, comprising a further step of:

supporting said wafer at a center of said wafer while performing said step of cutting said masking film.

14. A method for adhering a masking film onto a wafer according to claim 7, comprising a further step of:

sensing whether said wafer has passed through said upper adhesive roller and said lower adhesive roller.

15. A method for adhering a masking film onto a wafer according to claim 7, further comprising a step of:

taking up said masking film remaining after said step of cutting said masking film.

16. A method for adhering a masking film onto a wafer, comprising the steps of:

sticking said wafer onto a masking film tape by passing said wafer and said masking film tape through an upper adhesive roller and a lower adhesive roller; and increasing a separation of said masking film tape from a lower structure by a predetermined distance so that said masking film tape is not adhered to said lower structure, said step of increasing said separation of said masking film tape from said lower structure being performed by moving upwardly said upper adhesive roller immediately after said wafer passes through said upper adhesive roller and said lower adhesive roller;

transporting said masking film tape to a cutting location, maintaining a regular distance between said lower structure and said masking film tape; and cutting said masking film tape along a shape of said wafer at said cutting location.

17. A method for adhering a masking film onto a wafer, comprising the steps of:

adhering said wafer onto a masking film by passing said wafer and said masking film through an upper adhesive roller and a lower adhesive roller;

increasing a separation of said masking film from a lower structure by moving upwardly said upper adhesive roller immediately after said wafer passes through said upper adhesive roller and said lower adhesive roller;

transporting said masking film to a cutting location while maintaining a distance between said lower structure and said masking film while applying a tension force to said masking film in a crosswise direction of said masking film; and cutting said masking film along a periphery of said wafer at said cutting location.

18. A method for adhering a masking film onto a wafer according to claim 17 wherein:

said tension force is applied to said masking film by grooves formed in said upper adhesive roller.

19. A method for adhering a masking film onto a wafer according to claim 18, wherein:

said grooves are formed in said upper adhesive roller perpendicular to a forward moving direction of said masking film.

* * * * *